United States Patent
Okada et al.

(10) Patent No.: US 10,122,159 B2
(45) Date of Patent: Nov. 6, 2018

(54) ELECTRIC CONNECTION BOX

(71) Applicant: Yazaki Corporation, Minato-ku, Tokyo (JP)

(72) Inventors: Eiji Okada, Hiroshima (JP); Tomoyasu Murakami, Hiroshima (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 15/433,084

(22) Filed: Feb. 15, 2017

(65) Prior Publication Data

US 2017/0163016 A1 Jun. 8, 2017

Related U.S. Application Data

(63) Continuation of application No. PCT/JP2015/075857, filed on Sep. 11, 2015.

(30) Foreign Application Priority Data

Sep. 12, 2014 (JP) .................. 2014-185865
Sep. 12, 2014 (JP) .................. 2014-185866

(51) Int. Cl.
*B60R 16/02* (2006.01)
*H02G 3/08* (2006.01)
(Continued)

(52) U.S. Cl.
CPC .............. *H02G 3/088* (2013.01); *B60R 16/02* (2013.01); *B60R 16/0238* (2013.01); *H02G 3/081* (2013.01); *H05K 5/0217* (2013.01)

(58) Field of Classification Search
CPC ...... B60R 16/02; B60R 16/0238; H02G 3/16; H02G 3/081; H02G 3/088; H02G 3/08;
(Continued)

(56) References Cited

U.S. PATENT DOCUMENTS 4,871,884 A    10/1989  Hayashi
6,460,642 B1 * 10/2002  Hirano .................... B60K 6/40
                                                        180/271
(Continued)

FOREIGN PATENT DOCUMENTS

JP        63167329 U    10/1988
JP          161822 U     4/1989
(Continued)

OTHER PUBLICATIONS

International Search Report and Written Opinion dated Dec. 22, 2015, issued by the International Search Authority in counterpart International Application No. PCT/JP2015/075857 (PCT/ISA/210, PCT/ISA/220, & PCT/ISA/237).

*Primary Examiner* — Timothy Thompson
*Assistant Examiner* — Guillermo Egoavil
(74) *Attorney, Agent, or Firm* — Sughrue Mion, PLLC

(57) ABSTRACT

An electric connection box includes: a main body case; and an upper cover which engages with the main body case. The main body case includes a base wall which has an electric component mounting portion; a peripheral wall which is disposed on the base wall and partitions an inside and an outside of the main body case; a main body interior drainage port which is disposed at a place with possibility of water infiltration into an inside of the peripheral wall along a gap portion between the upper cover and the peripheral wall and passes through the base wall; and at least one main body interior drainage wall which is erected on the base wall and extends toward an opening edge of the main body interior drainage port on a surface of the base wall.

10 Claims, 12 Drawing Sheets

(51) Int. Cl.
*H05K 5/02* (2006.01)
*B60R 16/023* (2006.01)

(58) Field of Classification Search
CPC .... H05K 5/0213; H05K 5/0217; H05K 7/026; H01R 13/11; H01R 13/5227; Y10S 220/06
USPC ............ 174/59, 535, 520, 560; 220/DIG. 6; 361/752
See application file for complete search history.

(56) References Cited

U.S. PATENT DOCUMENTS

| | | | |
|---|---|---|---|
| 7,639,476 B2 * | 12/2009 | Sasaki | ................ H01R 13/5227 174/50 |
| 8,878,059 B2 | 11/2014 | Makino | |
| 2010/0307814 A1 * | 12/2010 | Aoki | ................... B60R 16/0238 174/520 |
| 2012/0248275 A1 * | 10/2012 | Soh | ..................... B60R 16/0215 248/314 |
| 2013/0032371 A1 | 2/2013 | Makino | |
| 2013/0335889 A1 * | 12/2013 | Makino | ................ H05K 5/0239 361/641 |

FOREIGN PATENT DOCUMENTS

| | | |
|---|---|---|
| JP | 200210442 A | 1/2002 |
| JP | 201334320 A | 2/2013 |

\* cited by examiner

ELECTRIC CONNECTION BOX

CROSS REFERENCE TO RELATED APPLICATIONS

This application is a continuation of PCT application No. PCT/JP15/075857, which was filed on Sep. 11, 2015 based on Japanese Patent Application No. 2014-185865 filed on Sep. 12, 2014 and Japanese Patent Application No. 2014-185866 filed on Sep. 12, 2014, the contents of which are incorporated herein by reference.

BACKGROUND OF THE INVENTION

1. Field of the Invention

The present invention relates to an electric connection box which is mounted on an automobile.

2. Description of the Related Art

An example of an electric device mounted on a vehicle such as an automobile includes an electric connection box. The electric connection box is generally referred to as a relay box, a fuse box, a connection block, an electronic control unit box, or the like. In the related art, PTL 1 discloses techniques relating to the electric connection box. Hereinafter, a configuration and a structure of the electric connection box will be briefly described.

The electric connection box is mounted on, for example, an engine room of the automobile. The electric connection box includes an electric connection box main body, an upper cover covering an upper side opening of the electric connection box main body, and a lower cover covering a lower side opening of the electric connection box main body, as a functional portion thereof. The electric connection box main body includes a main body case which is made of resin, electric components which are mounted on an electric component mounting portion of the main body case, and an internal circuit which is assembled to the main body case and which electrically connects the electric components. The upper cover is provided to prevent water from directly infiltrating electric components or the like.

In addition to the electric component mounting portion, an outer peripheral wall with which the upper cover is engaged from the upper side and a lower cover is engaged from the lower side and an inner peripheral wall which is disposed on the inside of the outer peripheral wall are formed on the main body case. A portion engaging with the main body case is respectively formed in the upper cover and the lower cover and a drainage port is formed in the lower cover.

In a case where water infiltrates through the portion which engaging with the main body case in the upper cover and the gap portion between the outer peripheral wall and the main body case, the infiltrated water does not reach the inner peripheral wall, falls from the space between the outer peripheral wall and the inner peripheral wall to the lower cover side, and is drained from the drainage port to an outside portion of the electric connection box.

PTL 1 is JP-A-2013-34320.

SUMMARY OF THE INVENTION

In the related art, there are problems that the structure of the electric connection box becomes complicated and the size thereof becomes large since the structure which has double walls by forming the outer peripheral wall and the inner peripheral wall on the main body case, in order to suppress the water infiltration, is applied.

The invention has been made in view of the above circumstances, and an object thereof is to provide an electric connection box which is capable of simplifying the structure and reducing the size thereof.

In order to solve the above problem, the electric connection box according to the invention has the following configuration.

(1) An electric connection box includes a main body case and an upper cover which engages with the main body case. The main body case includes a base wall which has an electric component mounting portion; a peripheral wall which is disposed on the base wall and partitions an inside and an outside of the main body case; a main body interior drainage port which is disposed at a place with possibility of water infiltration into an inside of the peripheral wall along a gap portion between the upper cover and the peripheral wall and passes through the base wall; and at least one main body interior drainage wall which is erected on the base wall and extends toward an opening edge of the main body interior drainage port on a surface of the base wall.

According to the configuration of above (1), in a case where water infiltrates into the inside of the peripheral wall along the gap portion between the upper cover and the peripheral wall, the infiltrated water is guided by the main body interior drainage wall and falls into the main body interior drainage port, for example, is drained from the drainage port of the lower cover to the outside portion of the electric connection box. The invention adopts a structure which allows the water to infiltrate to the side of the base wall having the electric component mounting portion and drains the infiltrated water at the main body interior drainage wall and the main body interior drainage port in a case where the water infiltrates. Therefore, it is unnecessary to adopt the double wall structure as in the example in the related art and as a result, the structure can be simplified and be miniaturized.

(2) In the electric connection box according to above (1), a side wall of the electric component mounting portion is used as a portion or all of the main body interior drainage wall.

According to the configuration of above (2), the infiltrated water is guided by the main body interior drainage wall which includes the side wall of the electric component mounting portion and then falls into the case side drainage port. Since the side wall of the electric component mounting portion in guidance of the infiltrated water is used, it can contribute to the simplification of the structure.

(3) In the electric connection box according to above (1) or (2), a bracket which is fixed to an attachment target at a position higher than the peripheral wall is continuously formed on an outer surface of the peripheral wall in a place with possibility of water infiltration.

According to the configuration of above (3), even if the water is infiltrated into an inside of the peripheral wall along the bracket which is fixed at a position higher than the peripheral wall, the infiltrated water is guided by the main body interior drainage wall, falls into the main body interior drainage port, and then finally is drained to the outside portion of the electric connection box. Therefore, even in the electric connection box in which the bracket fixed at the position higher than the peripheral wall is provided and the water infiltration along the bracket is easily generated, water can be drained while achieving simplification and miniaturization of the structure.

It is unnecessary to adopt the double wall structure as in the example in the related art and as a result, the structure can be simplified and be miniaturized, by adopting a structure which drains water infiltrated along the bracket at the main body interior drainage path and the main body interior drainage port.

BRIEF DESCRIPTION OF THE DRAWINGS

FIG. 2A is a plan view, and FIG. 2B is a side view.

FIG. 12A is an expanded view, and FIG. 12B is a view illustrating a state of holding the wire harness.

DETAILED DESCRIPTION OF THE EXEMPLARY EMBODIMENTS

The electric connection box is configured to include a main body, an upper cover, and a lower cover. The main body of the electric connection box includes a main body case. A base wall having an electric component mounting portion and a peripheral wall which is disposed on an edge portion of the base wall and partitions an inside and an outside of the main body case are formed on the main body case.

A main body interior drainage port which passes through the base wall and at least one main body interior drainage wall which is erected on the base wall are formed on a place with possibility of water infiltration into an inside of the peripheral wall along a gap portion between the upper cover and the peripheral wall. Furthermore, the main body interior drainage wall is integrated in a watertight manner to the peripheral wall and is formed as a part continuous with an opening edge of the main body interior drainage port.

The invention adopts a structure which allows the water to infiltrate to the side of the base wall having the electric component mounting portion and drains the infiltrated water at the main body interior drainage wall and the main body interior drainage port in a case where the water infiltrates.

EXAMPLE

First Example

Figure 1:
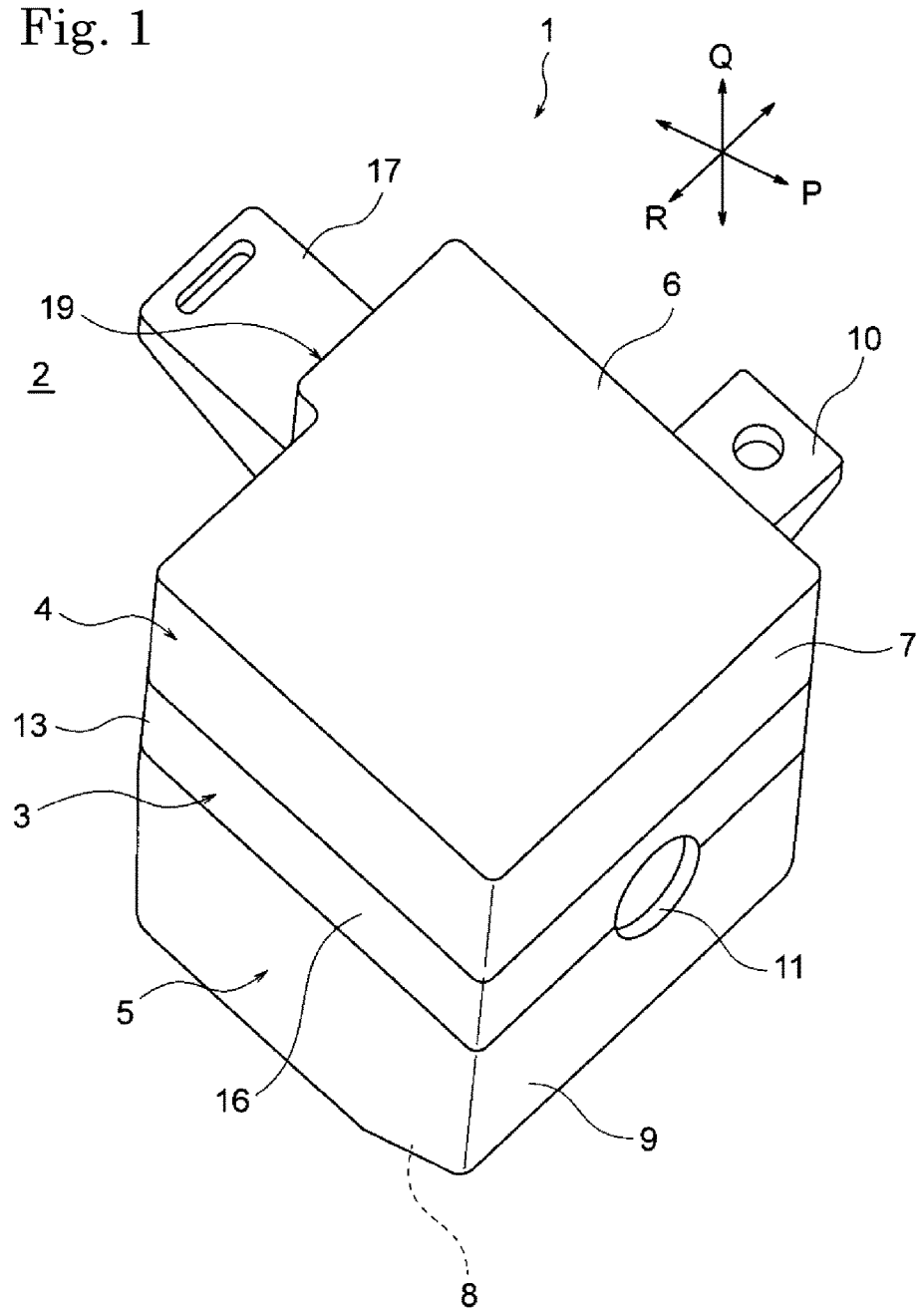
FIG. 1 is a perspective view illustrating an electric connection box according to a first example of the invention.
Figure 3:
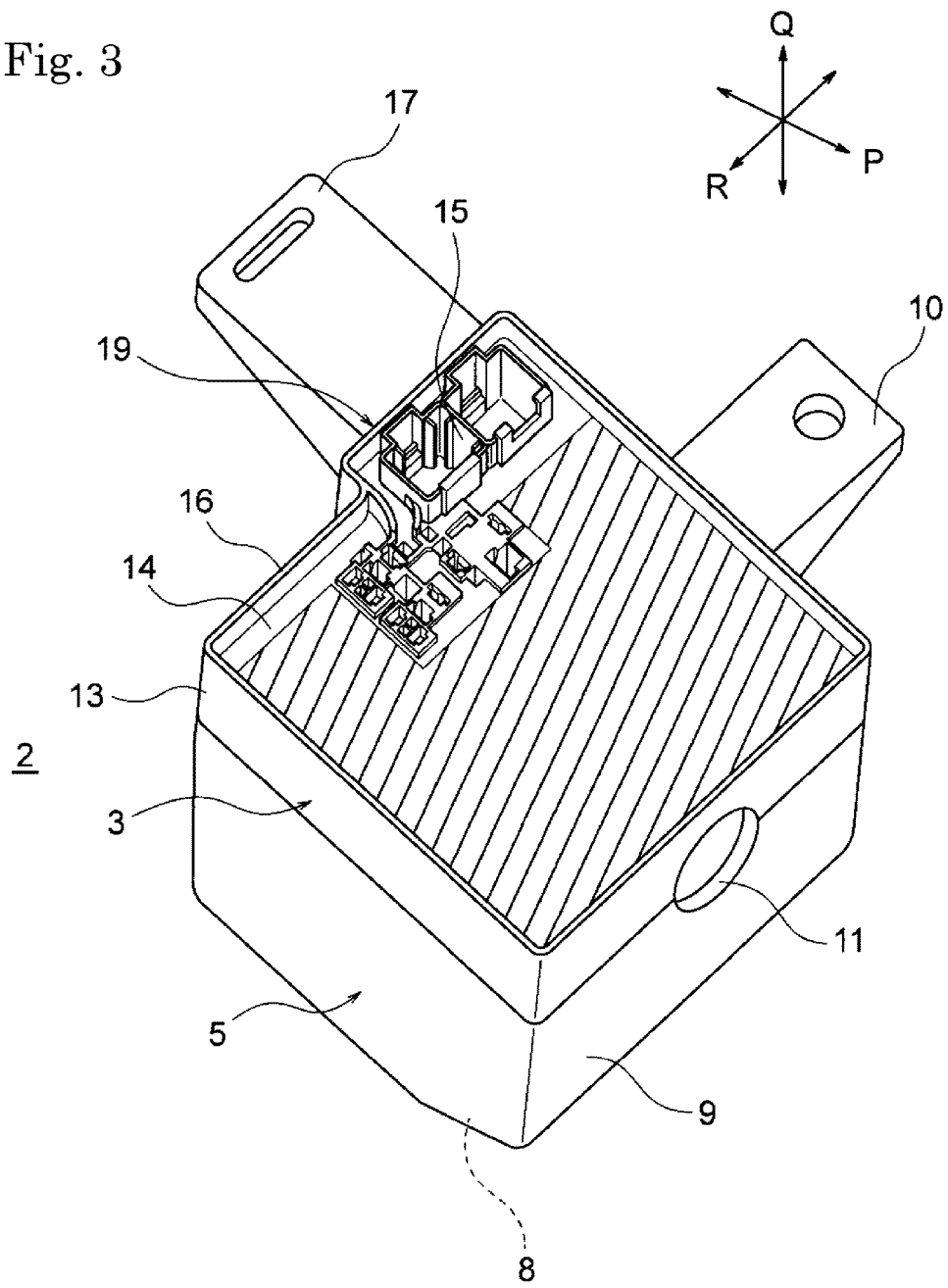
FIG. 3 is a perspective view illustrating the electric connection box main body (a perspective view of an electric connection box in a state of an upper cover being removed).
Figure 4:
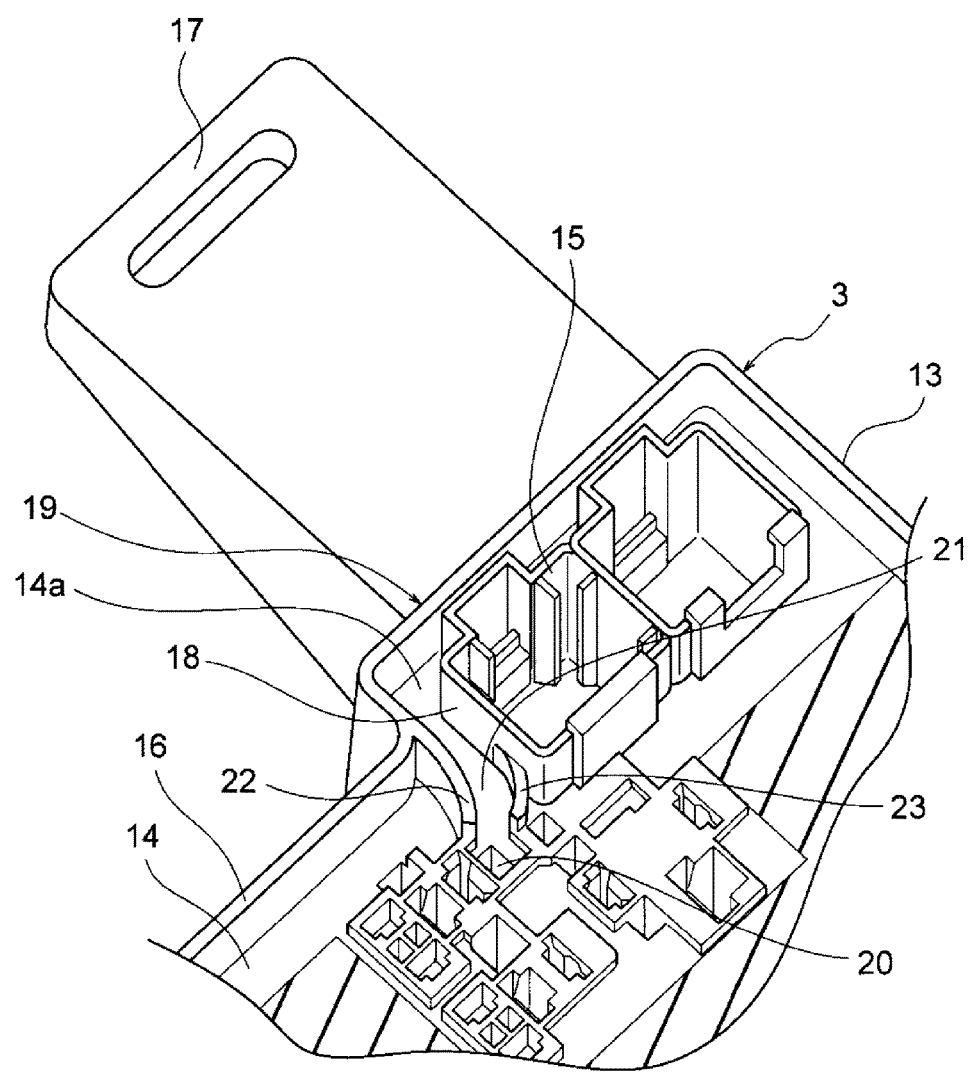
FIG. 4 is an expanded view illustrating the main portion of the FIG. 3.
Figure 5:
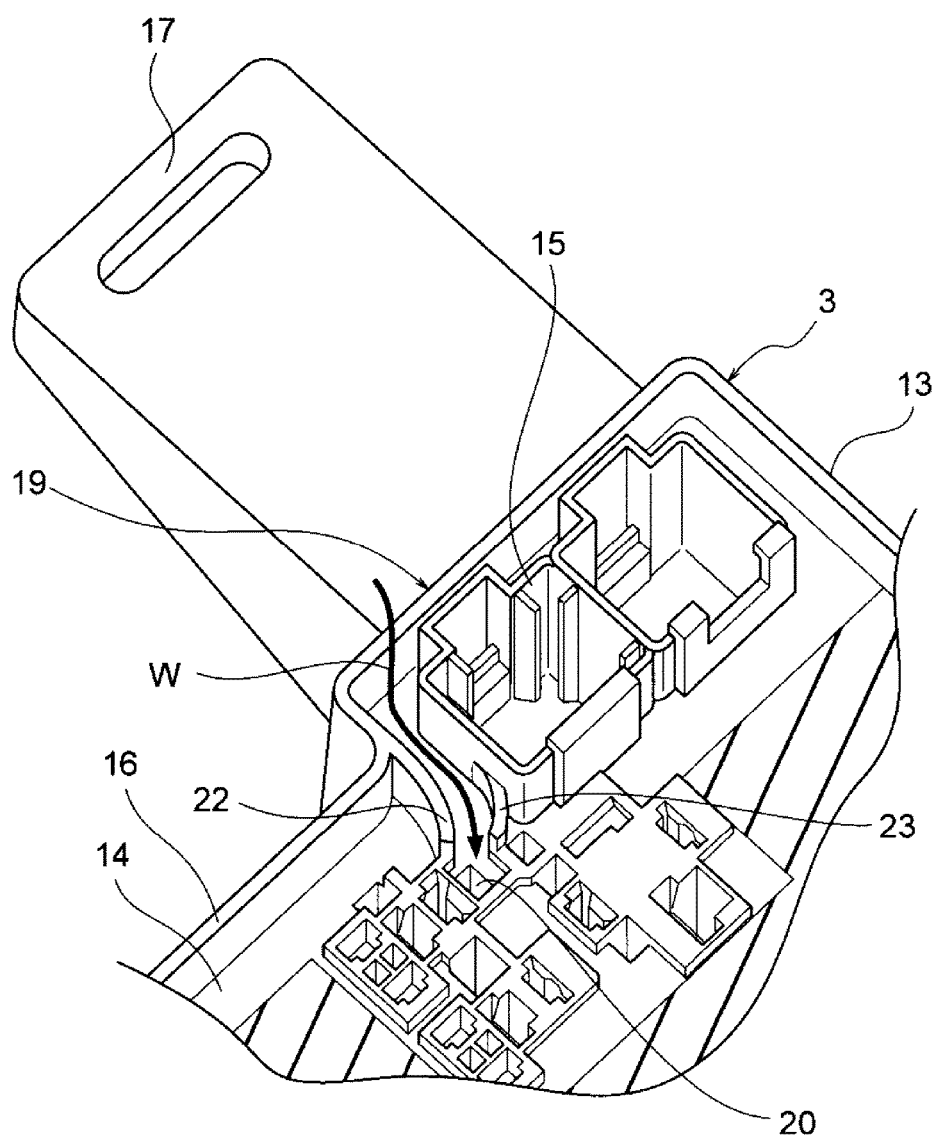
FIG. 5 is a view illustrating flow of water in FIG. 4.
Figure 6:
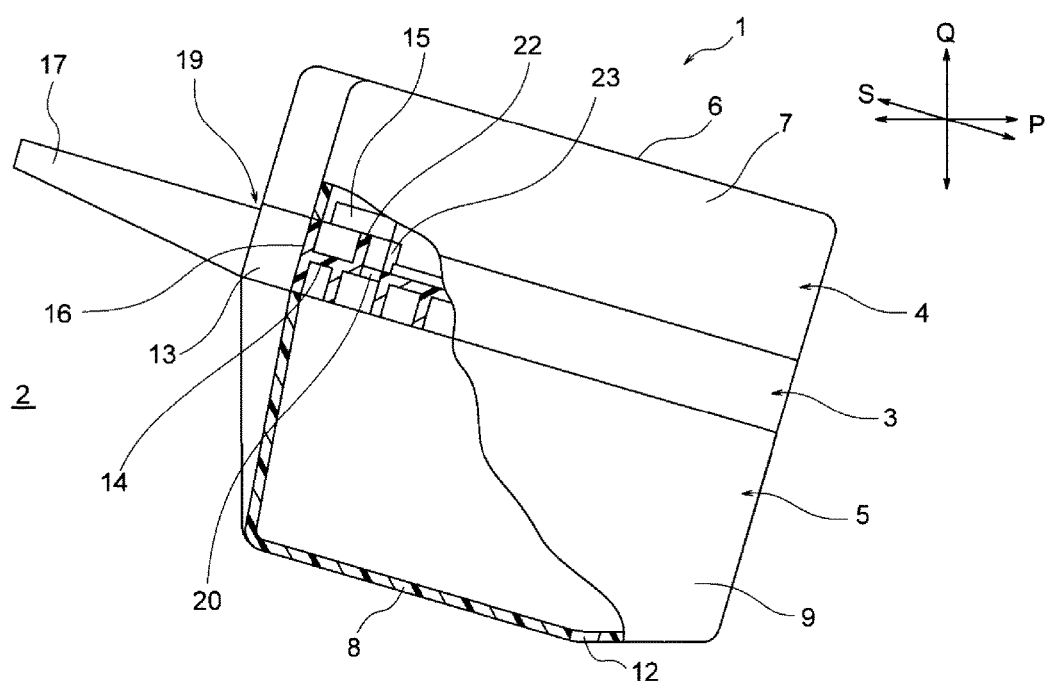
FIG. 6 is a side view (partial sectional view) illustrating the electric connection box.

Hereinafter, with reference to drawings, a first example will be described. FIG. 1 is a perspective view illustrating an electric connection box according to a first example of the invention. In addition, FIG. 2A is a plan view illustrating the electric connection box and FIG. 2B is a side view illustrating the electric connection box, FIG. 3 is a perspective view illustrating an electric connection box main body, FIG. 4 is an expanded view illustrating the main portion of the FIG. 3, FIG. 5 is a view illustrating flow of water in FIG. 4, and FIG. 6 is a side view (partial sectional view) illustrating the electric connection box.

Figure 2A:
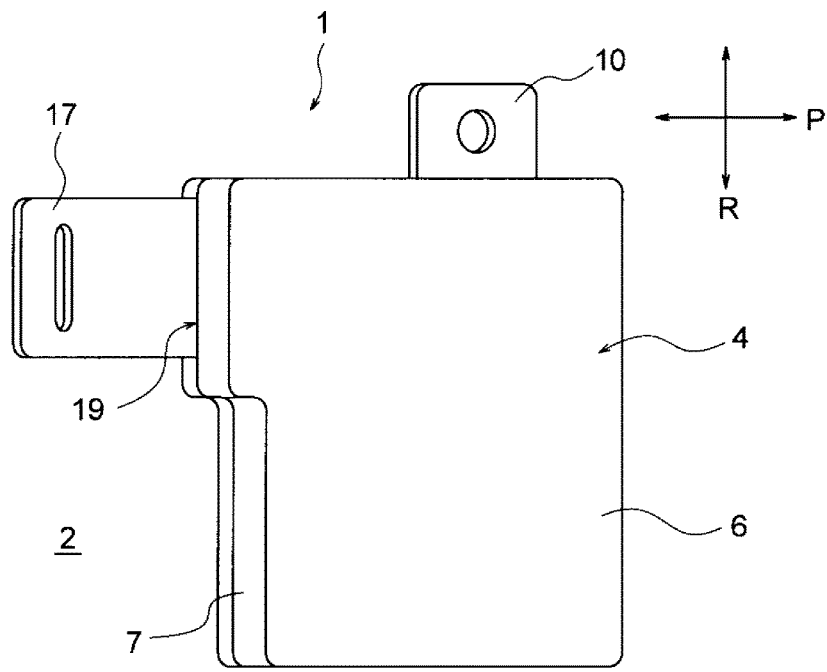
FIGS. 2A and 2B are views illustrating the electric connection box.
Figure 2B:
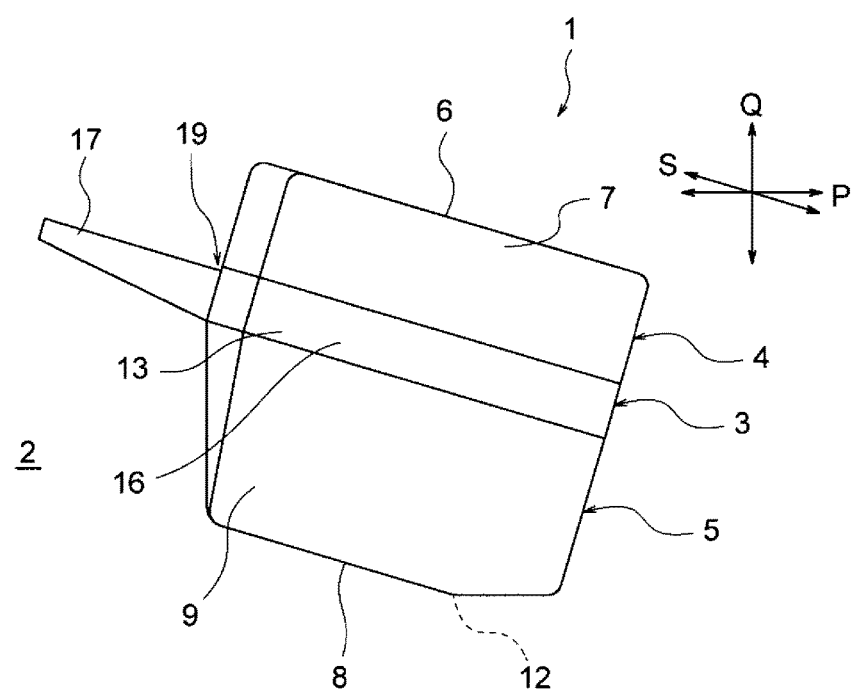

The electric connection box 1 is mounted on an engine room 2 of an automobile in FIG. 1 and FIGS. 2A and 2B. Arrows in the drawings indicate directions in the engine room 2. An arrow P indicates a front-rear direction, an arrow Q indicates a vertical direction, and an arrow R indicates a left-right direction, respectively. In addition, an arrow S (see FIG. 2B) indicates an inclined direction. The electric connection box 1 includes a main body 3, an upper cover 4 which covers an upper side opening of the main body 3, and a lower cover 5 which covers an lower side opening of the main body 3, as functional portions thereof.

First, the cover portions (upper cover 4 and lower cover 5) are described and next the main body 3 of the electric connection box 1 which is a functional portion is described.

The upper cover 4 is formed by injection molding using a resin material having insulating properties. The upper cover 4 has a ceiling wall 6, a peripheral wall 7 with a low height frame shape which is continuously formed with the edge of the ceiling wall 6, and a locking portion (not illustrated) which is formed on the peripheral wall 7. The lower end of the peripheral wall 7 is formed as an engagement portion with a cover engagement wall 16 of the main body case 13 described below. Further, the locking portion (not illustrated) is formed as a portion which is fitted into the main body case 13 to bring it into a locked state.

The upper cover 4 is provided to prevent water from directly infiltrating electric components to be described below (not illustrated) or the like.

The lower cover 5 is formed by injection molding using a resin material having insulating properties, like the upper cover 4. The lower cover 5 has a bottom wall 8, a peripheral wall 9 with a high height which is continuously formed with an edge portion of the bottom wall 8, a locking portion (not illustrated) which is integrally formed at a predetermined position of the peripheral wall 9, a bracket 10 which is integrally formed similarly at a predetermined position on the peripheral wall 9, and an electric wire lead-out portion 11 which leads out an electric wire (not illustrated).

A drainage port 12 (see FIG. 6) is formed at the lowermost position of the bottom wall 8, for example. The upper end of the peripheral wall 9 is formed as an engagement portion with the cover engagement wall 16 of the main body case 13 to be described below. A locking portion (not illustrated) is formed as a portion which is in a locked state so as not to deviate from the main body 3 of the electric connection box. The bracket 10 has a leg-like portion for fixing the electric connection box 1 to, for example, a body or the like in the engine room 2, and is formed in a wide width. The arrangement and the number of the brackets 10 are assumed as an example. The bracket 10 is fixed to the body or the like on the lower side than the main body 3.

A bracket 17 other than the bracket 10 is formed on the main body 3, and the bracket 17 will be described below.

In FIG. 1 to FIG. 3, the main body 3 is the functional portion of the electric connection box 1 as described above, and is configured to include a plurality of types of electric components (not illustrated) (a plurality of fuses, a plurality of fusible links, a plurality of relays, or the like), a bus bar unit (internal circuit: not illustrated) which electrically connects the electric component and the electric wire (not illustrated) with each other, and the main body case 13 which has structures (see FIG. 4) as a characteristic portions of the electric connection box 1 according to the invention.

In FIG. 3, the main body case 13 is formed by injection molding using a resin material having insulating properties. The main body case 13 has a base wall 14, an electric component mounting portion 15, a cover engagement wall 16 (peripheral wall), and a bracket 17.

The base wall 14 is formed such that an upper surface (surface) thereof is inclined along the arrow S in an inclined direction in FIG. 2B. The electric component mounting portion 15 is a portion for mounting a plurality of types of electric components (not illustrated), respectively, and is formed in various shapes projecting or recessing from the upper surface of the base wall 14, respectively. In the example, since the electric component mounting portion 15 is related to the invention, it will be described below as a representative component thereof as an example. The hatching in the drawings indicates the electric component mounting part which is omitted.

The electric component mounting portion 15 is formed so as to project from the upper surface of the base wall 14. The electric component mounting portion 15 has a side wall 18. The side wall 18 will be described in the following description and will be used as a portion of a main body interior drainage wall 23 to be described below.

The cover engagement wall 16 is arranged and formed so as to be integrated with the edge portion of the base wall 14. The cover engagement wall 16 is configured by a wall projecting upwardly and a wall projecting downwardly. The cover engagement wall 16 is formed such that the lower end of the peripheral wall 7 of the upper cover 4 is engaged with the leading end of a wall projecting upwardly. In addition, the upper end of the peripheral wall 9 of the lower cover 5 is formed to be engaged with the leading end of the wall projecting downwardly. A locking portion on the main body side facing the locking portions (not illustrated) of the upper cover 4 and the lower cover 5 is formed on the outer surface of the cover engagement wall 16. Since the base wall 14 is inclined in the direction of the arrow S (see FIG. 2B) as described above, the cover engagement wall 16 is integrally formed on the base wall 14 in a state of being matched with this inclination.

The bracket 17 is a leg-like portion fixed to an attachment target at a position higher than the cover engagement wall 16, and is formed continuously to the outer surface of the cover engagement wall 16. The bracket 17 is formed in a wide width as the bracket 10 of the lower cover 5. The bracket 17 is formed as a portion for fixing the electric connection box 1 to, for example, a body or the like in the engine room 2. Since the bracket 17 is fixed at a position higher than the cover engagement wall 16, there is a possibility that water attached to the bracket 17 is stayed on the continuous portion of the outer surface of the cover engagement wall 16 along the bracket 17. Because of this, a structure that is a characteristic portion of the electric connection box 1 according to the invention is adopted. Hereinafter, the structure which is a characteristic portion will be described in detail.

In FIG. 4, reference numeral 19 indicates "a place with possibility of water infiltration". In the example, the place 19 with possibility of water infiltration is a place where the bracket 17 is continuous and specifically corresponds to a place with possibility of water infiltration in the inside of the cover engagement wall 16 along the gap portion between the upper cover 4 and the cover engagement wall 16.

In the place 19 with possibility of water infiltration, a structure which is a characteristic portion of the electric connection box 1, that is, a main body interior drainage port 20 and a main body interior drainage path 21 are formed in the main body case 13. The main body interior drainage port 20 is formed to pass through a base wall 14. The main body interior drainage port 20 is disposed on a desired portion (hollow portion or the like) of the base wall 14, and is formed so as to be capable of facing the inside portion of the lower cover 5 in the example (see FIG. 6). The main body interior drainage port 20 is formed as a portion to fall the infiltrated water into the lower cover 5. In the example, although the main body interior drainage port 20 is formed in a shape that opens in a rectangular shape in a plan view, it is not limited to this shape, and it may be a circle, a triangle, or the like.

The main body interior drainage path 21 is configured by a base wall 14a which is the bottom portion and main body interior drainage walls 22 and 23 which are erected on both sides of the base wall 14a which is the bottom portion. The main body interior drainage path 21 is formed to face the main body interior drainage port 20 which passes through the base wall 14a which is the bottom portion. The base wall 14a which is the bottom portion is a portion of the base wall 14 which is inclined along the direction of the arrow S in FIG. 2B, and is formed so as to be capable of guiding the infiltrated water by using this inclination (This is an example. The base wall 14a may be a horizontal plane without inclination). The main body interior drainage port 20 is disposed and formed at a position downward from the base wall 14a which is the bottom portion.

The main body interior drainage walls 22 and 23 are formed as water guiding walls for guiding the infiltrated water. The main body interior drainage walls 22 and 23 are formed in such a shape as to smooth the flow of water (see a thick arrow W in FIG. 5) and not to lead to a pool.

One end of the main body interior drainage wall 22 of one of the two water guiding walls is formed in a portion which is integrated with the inner surface of the cover engagement wall 16. Further, the other end thereof is formed in a portion which is continuous to the opening edge of the main body interior drainage port 20. In the example, the height of the main body interior drainage wall 22 is set according to the height of the cover engagement wall 16 (This is an example. So long as the height of the main body interior drainage wall 22 is a height at which water can be guided, the height thereof is not particularly limited to this).

The main body drainage wall 23 of the other of the two water guiding walls is configured to include a side wall 18 of the electric component mounting portion 15. The main body interior drainage wall 23 is formed in a portion which is continuous to the opening edge of the main body interior drainage port 20, as in the main body interior drainage wall 22.

In the above configuration and the structure, the infiltrated water is guided as illustrated by the thick arrow W in the place 19 with possibility of water infiltration, as illustrated in FIG. 5. In the example, since there is the inclination, water is naturally guided. If vibrations are transmitted during traveling or the like, water is reliably guided to the main body interior drainage port 20.

As described above with reference to FIG. 1 to FIG. 6, according to the invention, in a case where water infiltrates into the inside of the cover engagement wall 16 along the gap portion between the upper cover 4 and the cover engagement wall 16, the infiltrated water is guided by the main body interior drainage path 21 including the main body interior drainage walls 22 and 23, falls into the main body interior drainage port 20 and is drained from the drainage port 12 of the lower cover 5 to the outside portion of the electric connection box 1.

Since the invention adopts a structure that, in a case where water infiltrates, the water permits infiltration to the side of the base wall 14 having the electric component mounting portion 15 and the infiltrated water is drained at the main body interior drainage path 21 and the main body interior drainage port 20, the invention is unnecessary to adopt the double wall structure as in the example in the related art. As a result, the structure can be simplified and miniaturization can be achieved. If the structure can be simplified, cost reduction can be achieved.

In addition, the invention can contribute to the simplification of the structure, since the side wall 18 of the electric component mounting portion 15 is used in guidance of the infiltrated water.

Second Example

Figure 7:
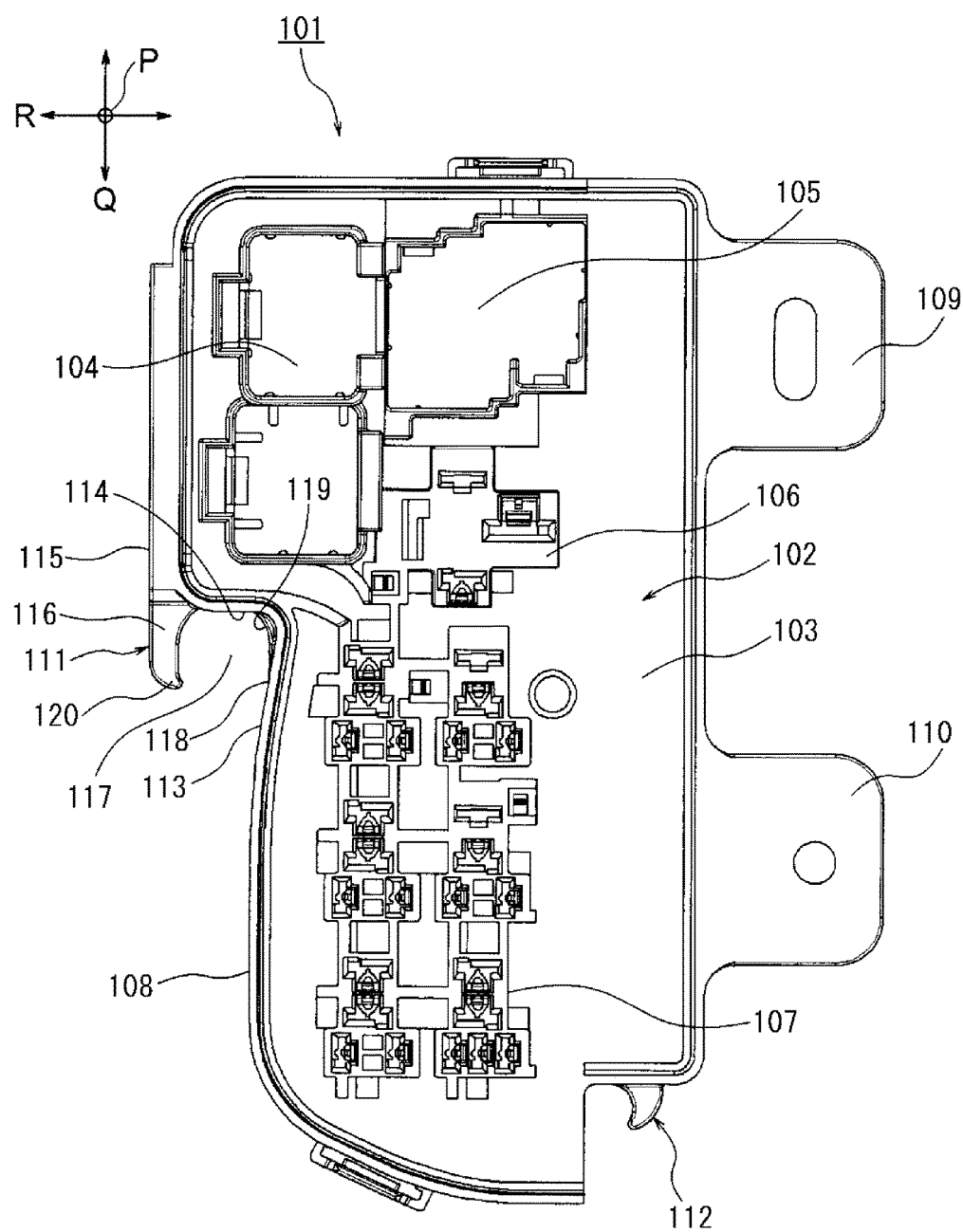
FIG. 7 is a plan view illustrating an electric connection box main body constituting an electric connection box according to a second example of the invention.
Figure 9:
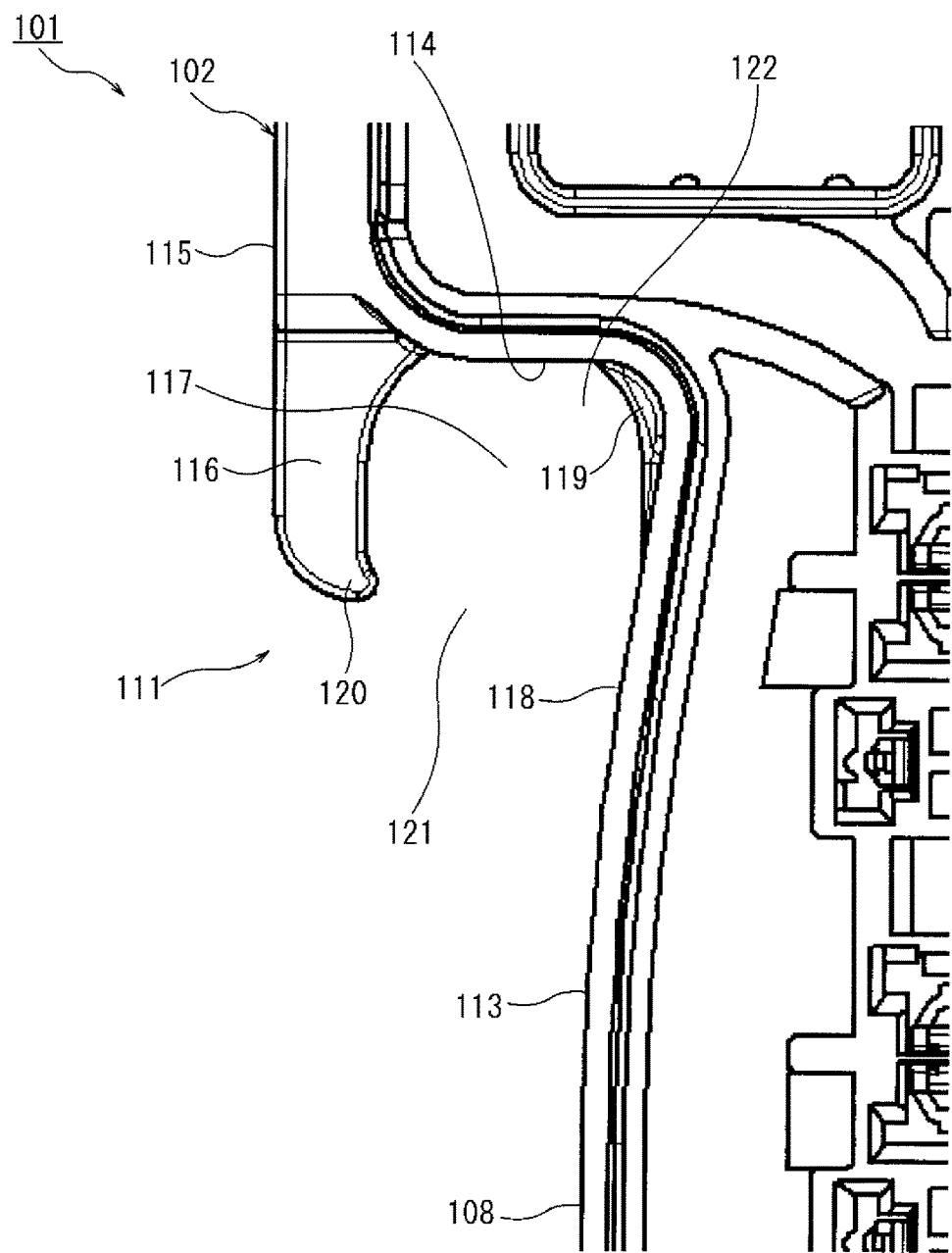
FIG. 9 is an expanded view illustrating the main portion of the FIG. 7.
Figure 10:
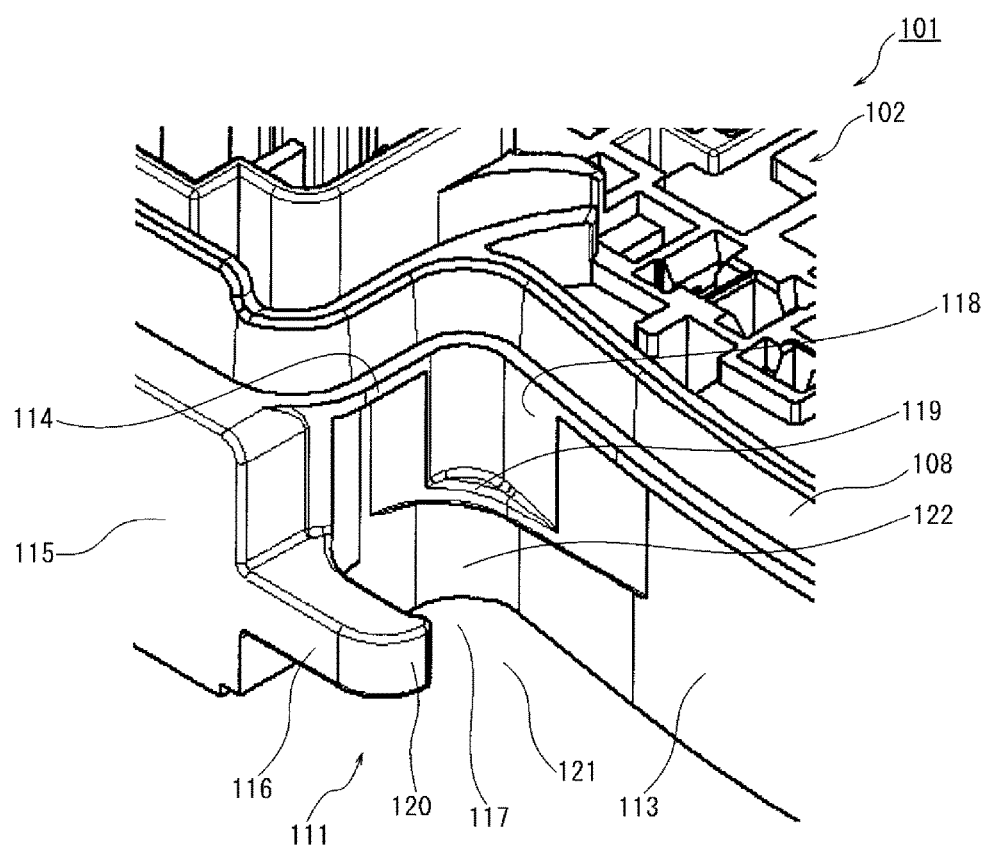
FIG. 10 is an expanded view illustrating the main portion of the FIG. 8.
Figure 11:
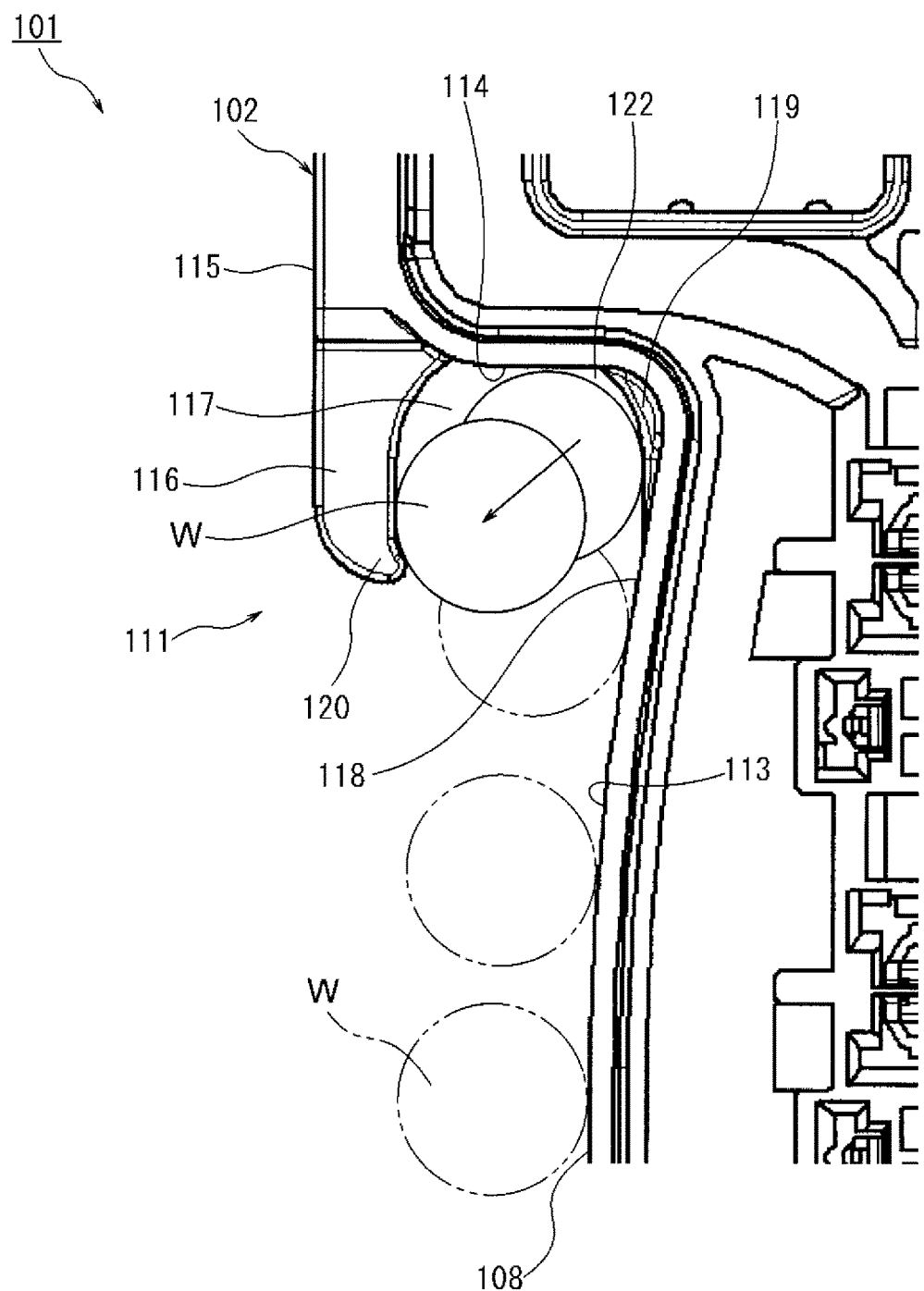
FIG. 11 is view illustrating a process related to holding of a wire harness.
Figure 12A:
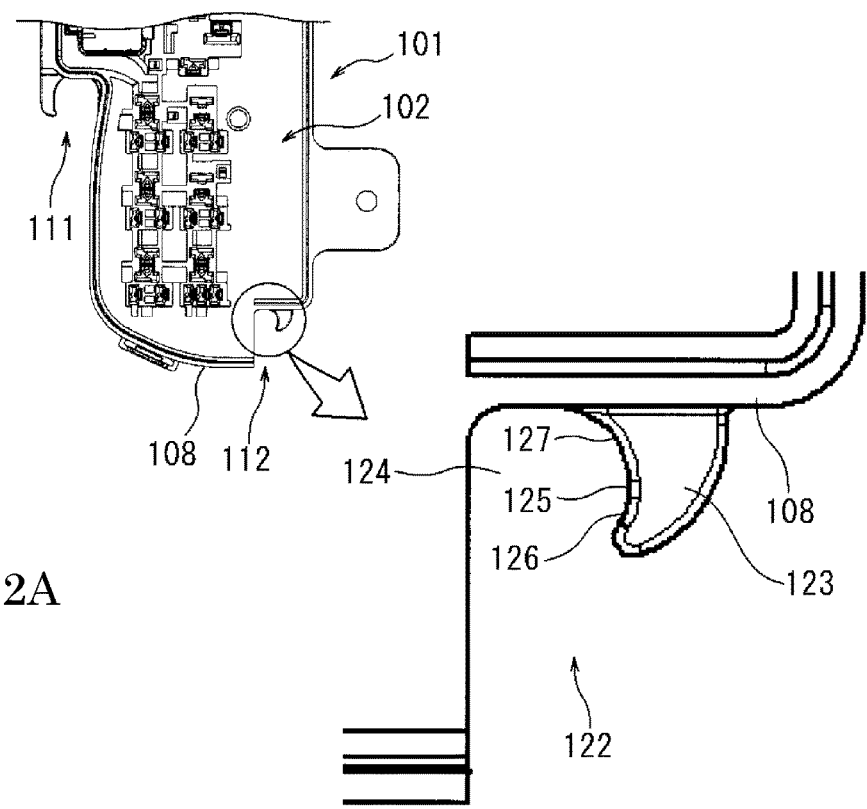
FIGS. 12A and 12B are views illustrating another hook.
Figure 12B:
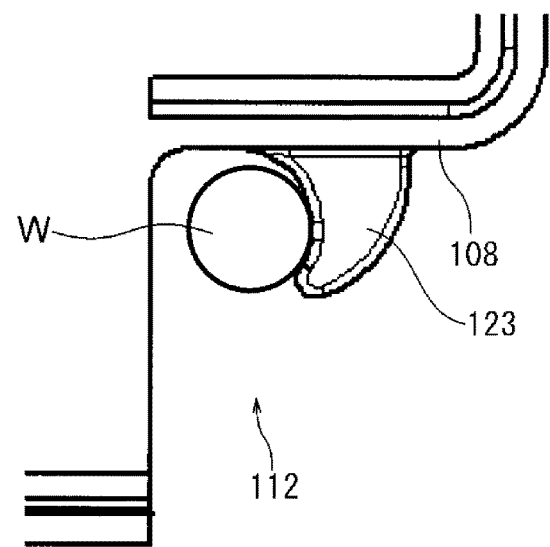

Hereinafter, a second example will be described with reference to the drawings. FIG. 7 is a plan view illustrating an electric connection box main body constituting an electric connection box according to a second example of the invention. In addition, FIG. 8 is a perspective view illustrating the electric connection box main body in FIG. 7, FIG. 9 is an expanded view illustrating the main portion of the FIG. 7, FIG. 10 is an expanded view illustrating the main portion of the FIG. 8, FIG. 11 is view illustrating a process related to holding of a wire harness, and FIGS. 12A and 12B are views illustrating another hook.

Figure 8:
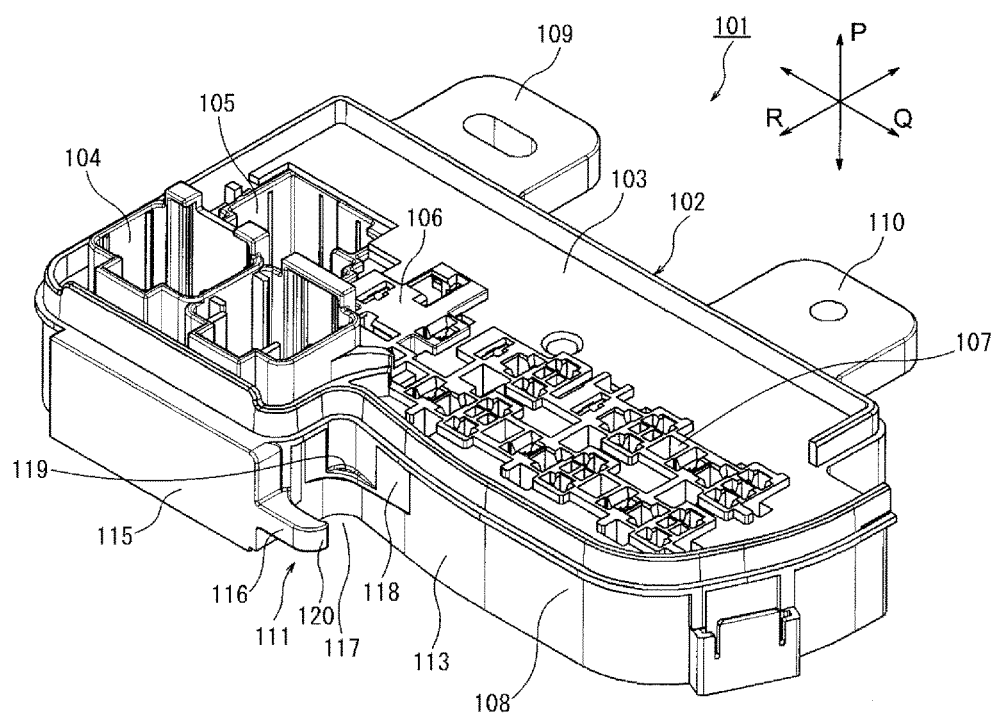
FIG. 8 is a perspective view illustrating the electric connection box main body in FIG. 7.

An electric connection box main body 101 constituting an electric connection box according to a second example of the invention is illustrated in FIG. 7 and FIG. 8. For example, in a case where an arrow P in FIG. 8 is defined as a vertical direction, the upper side opening of the electric connection box main body 101 is covered with an upper cover (not illustrated). Further, the lower side opening of the electric connection box main body 101 is covered with a lower cover (not illustrated). The electric connection box is mounted on an engine room of an automobile. The arrow Q in FIG. 7 and FIG. 8 is described as a front-rear direction, and an arrow R is described as a left-right direction.

The electric connection box main body 101 is a functional portion of the electric connection box and is configured to include a plurality of types of electric components (fuses, fusible links, relays, or the like) (not illustrated), a bus bar unit (not illustrated) which electrically connects the electric components and a wire harness W (see FIG. 11, thick electric wires or electric wire bundles) with each other, and a main body case 102 in which the characteristic portion of the invention is provided. The bus bar unit is assembled from the lower side of the main body case 102. Further, the electric components are mounted on the electric component mounting portions 104 to 107 described below from the upper side of the main body case 102.

The main body case 102 is formed in the shape illustrated for example by injection molding using a resin material having insulating properties. The main body case 102 is formed with a base wall 103, a plurality of electric component mounting portions 104 to 107, and an outer peripheral wall 108, and brackets 109 and 110, and a harness holding portion 111 and 112 are provided at predetermined positions of the outer peripheral wall 108.

The base wall 103 is formed on a plate-like portion so that the upper surface (surface) thereof is flat (This is an example). The electric component mounting portions 104 to 107 are portions for mounting a plurality of types of electric components (not illustrated), and are formed in various shapes as projecting from the upper surface of the base wall 103, respectively. The outer peripheral wall 108 is arranged and formed so as to be integrated with the edge portion of the base wall 103. The outer peripheral wall 108 is configured by a wall projecting upwardly and a wall projecting downwardly from a position integrated with the base wall 103. The outer peripheral wall 108 is formed such that an upper cover (not illustrated) engages with a leading end of the wall projecting upwardly. Further, a leading end of the wall projecting downwardly is formed to engage with a lower cover (not illustrated). The brackets 109 and 110 are portions for fixing the electric connection box to, for example, a body or the like in the engine room, and are formed in a wide width.

A harness holding portion 111 is a portion which holds a wire harness W (see FIG. 11) which is led out from the lower cover (not illustrated) and a wire harness W which faces another portion (in the engine room) irrespective of the lower cover in a state of being aligned to the outer peripheral wall 108 in the vertical direction. In the example, the harness holding portion 111 is provided according to a position which is bent in a substantially crank shape in plan view of the outer peripheral wall 108. In the following description, there is also a case where the outer peripheral wall 108 at a position which is bent in a substantially crank shape is divided into a first outer peripheral wall 113 of the holding portion, a second outer peripheral wall 114 of the holding portion and the third outer peripheral wall 115 of the holding portion and then is described, as illustrated in FIG. 7 or the like. An outer peripheral wall 118 having a slope shape to be described below is formed in the first outer peripheral wall 113 of the holding portion.

In FIG. 9 to FIG. 11, the harness holding portion 111 includes a hook 116. A holding space 117 is formed in an inside of the hook 116. In addition, the outer peripheral wall 118 having a slope shape and a forming projection portion 119 are formed on the harness holding portion 111.

The hook 116 is formed so as to be capable of holding the wire harness W in the vertical direction. The hook 116 is formed on a projection portion having a substantially claw shape extending straight along the third outer peripheral wall 115 of the holding portion. Specifically, the hook is disposed on a position of a continuous portion between the third outer peripheral wall 115 of the holding portion and the second outer peripheral wall 114 of the holding portion, and is formed on the projection portion having a substantially claw shape so as to project in a front side along the third outer peripheral wall 115 of the holding portion (so as to project toward the lower side of the paper surface of FIG. 9). The hook 116 is thick and has rigidity, and is formed in a state that it is not deflected by the action from the wire harness W. The leading end 120 of such a hook 116 is formed in a shape which is capable of hooking the wire harness W toward the holding space 117.

The leading end 120 of the hook 116 is in a position (passing position) through which the wire harness W passes, and, in addition, the passage position becomes the holding space entrance 121, since the inside of the hook 116 is in the holding space 117. The position distant from the holding space entrance 121 is a holding space inside position 122. In the electric connection box according to the invention, the interval between the leading end 120 of the hook 116 and the first outer peripheral wall 113 of the holding portion at the holding space entrance 121 is set to be equal to or larger than the diameter of the wire harness W. In addition, at the front and rear of the holding space entrance 121, the first outer peripheral wall 113 of the holding portion is formed to have a slope shape to be gradually recessed to the inside of the main body case 102 toward the holding space inside position 122 (hereinafter, this portion is referred to as the outer peripheral wall 118 having a slope shape).

Although the outer peripheral wall 118 having a slope shape is formed as a portion of the first outer peripheral wall 113 of the holding portion, the outer peripheral wall 118 having a slope shape may be the entire first outer peripheral wall 113 of the holding portion. In the example, the first outer peripheral wall 113 of the holding portion is configured by the outer peripheral wall 118 having a slope shape and the forming projection portion 119, for better performance. The outer peripheral wall 118 having a slope shape is formed to have a gentle curved surface (the outer peripheral wall 108 at a position distant from the harness holding portion 111 to the front side is formed in a flat surface, and the flat surface is connected by a gentle curved surface to form the outer peripheral wall 118 having a slope shape). The outer peripheral wall 118 having a slope shape is formed so as to be capable of guiding the wire harness W toward the holding space entrance 121. In other words, the outer peripheral wall 118 having a slope shape is formed so that the wire harness W can be induced to be guided.

The forming projection portion 119 forms the outer peripheral wall 118 having a slope shape in a portion projecting toward the leading end 120 of the hook 116 at the holding space inside position 122. Further, the forming projection portion 119 is formed in a portion having a stepped shape at the holding space inside position 122. The forming projection portion 119 is disposed and formed on the lower side of the outer peripheral wall 118 having a slope shape. In addition, the forming projection portion 119 is formed according to the formation position (height position) of the hook 116.

In FIG. 11, when holding of the wire harness W is performed, the direction of the reaction force generated in the wire harness W is changed by the existence of the outer peripheral wall 118 having a slope shape. Further, when the wire harness W guided up to the holding space inside position 122 is in contact with the forming projection portion 119, and a bending force is applied using the stepped portion generated by the forming projection portion 119, the direction of the reaction force is changed toward the side of the hook 116. Therefore, it is possible to make it difficult for the wire harness W to be deviated in the electric connection box according to the invention. As a comparative example, in a case of a harness holding portion formed of a simple hook and the outer peripheral wall having a straight shape, although not illustrated, even if the wire harness is inserted along the outer peripheral wall having a straight shape, in a case where the interval of the holding space entrance is set to be equal to or larger than the diameter of the wire harness, the wire harness is easily deviated. In addition, after being inserted and accommodated in the harness holding portion, if the wire harness receives an external force in a direction opposite to the insertion direction, the wire harness is easily deviated. On the contrary, in the electric connection box according to the invention, since the first outer peripheral wall 113 of the holding portion becomes the outer peripheral wall 118 having a slope shape at the front and the rear of the holding space entrance 121 in order to be gradually recessed to the inside of the main body case 102 toward the holding space inside position 122, the first outer peripheral wall 113 of the holding portion becomes a portion effective for preventing getting off in a case where the wall portion receives an external force in a direction which coincides with the direction opposite to the insertion direction in the above-described comparative example.

The electric connection box according to the invention can also do the following except for being capable of making the getting off of the wire harness W to be difficult. In other words, since the interval between the leading end 120 of the hook 116 and the first outer peripheral wall 113 of the holding portion at the holding space entrance 121 is set to be equal to or larger than the diameter of the wire harness W, the wire harness W can be smoothly guided.

As described above with reference to FIG. 7 to FIG. 11, according to the invention, there is an effect that, regarding to the holding of the wire harness W, workability thereof is excellent and the wire harness W cannot be easily removed.

In addition, according to the invention, since the outer peripheral wall 118 having a slope shape is formed so as to be gradually recessed to the inside of the main body case 102 toward the holding space inside position 122, the increase in size of the portion which holds the wire harness W is effectively suppressed. Therefore, according to the invention, space saving can be achieved.

The above-mentioned features related to the holding of the wiring harness W can be naturally applied not only to the harness holding portion 111 but also to other portions.

Although not adopting the above-mentioned features, holding of the wire harness W to be described below is also effective as a reference example.

In FIGS. 12A and 12B, the harness holding portion 112 has a hook 123 and is provided according to the position in which the outer peripheral wall 108 is bent at right angles. A holding space 124 is formed inside the hook 123. The hook 123 is formed in the illustrated shape having a straight portion 125 having a short length and curved portions 126 and 127 which are continuous to both ends of the straight portion 125.

Therefore, in a case where holding of the wire harness W is performed or the wire harness W is in contact with two portions of the straight portion 125 and the curved portion 126, the holding position can be easily known by the operator. In addition, since the length of the straight portion 125 is short even if the wire harness W is slightly shifted, the wire harness W can be in contact with two portions of the straight portion 125 and the curved portion 127. Even in this case, the holding position is easily known. In other words, the optimum holding position (optimum holding range) is easy to known by the operator and is effective.

Here, the features of the embodiment of the electric connection box according to the invention described above are summarized briefly in the following [1] to [3], respectively.

[1] An electric connection box includes a main body case (13) and an upper cover (4) which engages with the main body case. The main body case includes a base wall (14) which has an electric component mounting portion (15); a peripheral wall (16) which is disposed on the base wall and partitions an inside and an outside of the main body case; a main body interior drainage port (20) which is disposed at a place (19) with possibility of water infiltration into an inside of the peripheral wall along a gap portion between the upper cover and the peripheral wall and passes through the base wall; and at least one main body interior drainage wall (22) and (23) which are erected on the base wall and extends toward an opening edge of the main body interior drainage port on a surface of the base wall.

[2] In the electric connection box according to above [1], a side wall of the electric component mounting portion is used as a portion or all of the main body interior drainage wall.

[3] In the electric connection box according to above [1] or [2], a bracket (17) which is fixed to an attachment target at a position higher than the peripheral wall is continuously formed on an outer surface of the peripheral wall in a place with possibility of water infiltration.

Although the invention has been described in detail and with reference to specific embodiments, it will be apparent to those skilled in the art that various changes and modifications can be made without departing from the spirit and scope of the invention.

According to the invention, since adopting a structure which drains infiltrated water at the main body interior drainage path and the main body interior drainage port, it is unnecessary to adopt the double wall structure as in the example in the related art and the structure can be simplified and be miniaturized. The invention which exhibiting this effect is useful with respect to the electric connection box.

What is claimed is:

1. An electric connection box, comprising:
a main body case; and
an upper cover which engages with the main body case, wherein the main body case comprises:
   a base comprising an electric component mounting portion;
   a peripheral wall which extends upwardly from the base and partitions an inside and an outside of the main body case;
   a main body interior drainage port provided in the base to pass through the base at a location away from the peripheral wall toward the inside of the main body case; and
   at least one main body interior drainage wall which projects upwardly from the base and extends away from the peripheral wall toward an opening edge of the main body interior drainage port on a surface of the base so as to define a channel for water drainage,
wherein a side wall of the electric component mounting portion defines a portion of or all of the at least one main body interior drainage wall.

2. The electric connection box according to claim 1, wherein a bracket which is fixed to an attachment target at a position higher than the peripheral wall is continuously formed on an outer surface of a portion of the peripheral wall, and
wherein the at least one main body interior drainage wall is arranged to guide water entering through a gap between the upper cover and the portion of the peripheral wall to the main body interior drainage port.

3. An electric connection box, comprising:
a main body case; and
an upper cover which engages with the main body case, wherein the main body case comprises:
   a base comprising an electric component mounting portion;
   a peripheral wall which extends upwardly from the base and partitions an inside and an outside of the main body case;
   a main body interior drainage port provided in the base to pass through the base at a location away from the peripheral wall toward the inside of the main body case; and
   at least one main body interior drainage wall which projects upwardly from the base and extends away from the peripheral wall toward an opening edge of the main body interior drainage port on a surface of the base so as to define a channel for water drainage,
wherein the at least one main body interior drainage wall comprises a pair of main body interior drainage walls so as to define the channel for the water drainage.

4. The electric connection box according to claim 3, wherein the main body case further comprises:
a wire harness holding portion provided on an outside of the peripheral wall.

5. The electric connection box according to claim 4, wherein the wire harness holding portion comprises a first wire harness holding portion formed of a hook.

6. The electric connection box according to claim 4, wherein the wire harness holding portion comprises a first wire harness holding portion formed of a hook and a second wire harness holding portion formed of a hook.

7. The electric connection box according to claim 5, wherein the first wire harness holding portion is defined by the peripheral wall, and
wherein a portion of the peripheral wall defining the first wire harness holding portion is sloped so as to be gradually recessed to the inside of the main body case.

8. The electric connection box according to claim 7, wherein a portion of the peripheral wall defining the first wire harness holding portion comprises a forming projection portion disposed on the inside of the wire harness holding portion.

9. The electric connection box according to claim 8, wherein the forming projection portion has a stepped shape.

10. The electric connection box according to claim 4, wherein the electric connection box further comprises a bracket.

* * * * *